(12) United States Patent
Bloom et al.

(10) Patent No.: US 6,532,746 B1
(45) Date of Patent: Mar. 18, 2003

(54) METHOD AND APPARATUS FOR SECURING AN ELECTRONIC COMPONENT

(75) Inventors: Eliot Bloom, Hopkinton, NH (US); David Maxham, Jamesburg, NJ (US)

(73) Assignee: Tyco Telecommunications (US) Inc., Morristown, NJ (US)

(*) Notice: Subject to any disclaimer, the term of this patent is extended or adjusted under 35 U.S.C. 154(b) by 0 days.

(21) Appl. No.: 10/057,246

(22) Filed: Jan. 24, 2002

(51) Int. Cl.[7] .............................................. F25B 21/02
(52) U.S. Cl. ............................................ 62/3.7; 62/3.2
(58) Field of Search ........................ 62/3.2, 3.3, 36, 62/3.7, 259.1

(56) References Cited

U.S. PATENT DOCUMENTS

| | | | | |
|---|---|---|---|---|
| 3,816,182 A | * | 6/1974 | McAdam | 136/230 |
| 4,622,822 A | * | 11/1986 | Beitner | 62/3 |
| 4,704,872 A | * | 11/1987 | Jones | 62/3 |
| 5,398,510 A | * | 3/1995 | Gilley et al. | 62/3.6 |
| 5,901,030 A | * | 5/1999 | Logan et al. | 361/234 |

FOREIGN PATENT DOCUMENTS

| | | | | |
|---|---|---|---|---|
| JP | 5-10628 | * | 1/1993 | 62/3 |

* cited by examiner

*Primary Examiner*—Denise L. Esquivel
*Assistant Examiner*—Melvin Jones

(57) ABSTRACT

A securing apparatus is used to secure an electronic component, such as a thermoelectric cooler in a thermoelectric cooling system. The securing apparatus includes a clamping mechanism that clamps the electronic component between a first plate, such as a heat sink plate, and a second plate, such as a mounting plate. The clamping mechanism applies compression forces to the electronic component to secure the electronic component without using shear forces capable of damaging the electronic component. The clamping mechanism preferably provides thermal isolation between the heat sink plate and the mounting plate.

24 Claims, 4 Drawing Sheets

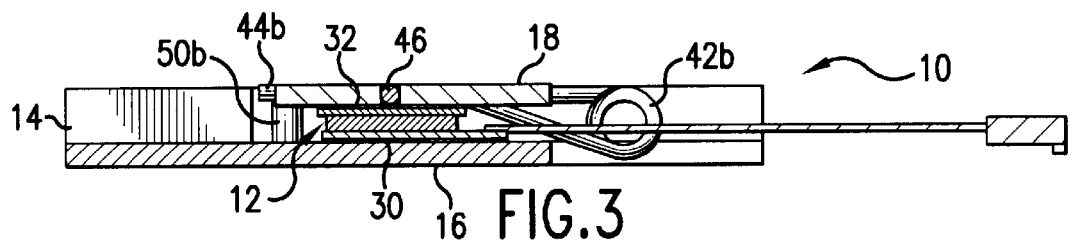
FIG.3
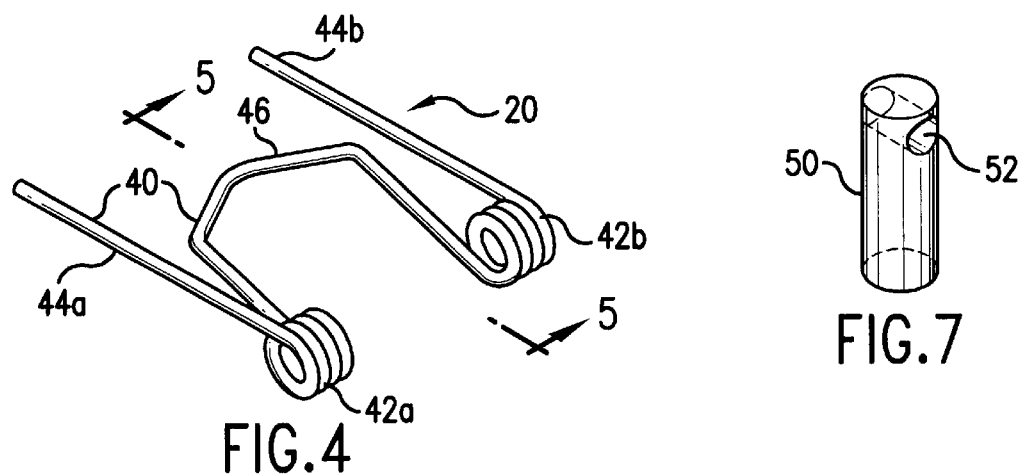
FIG.4
FIG.7
FIG.5
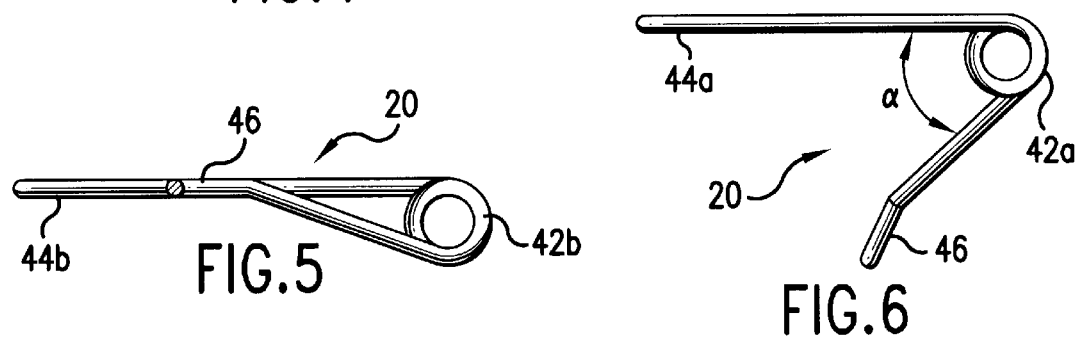
FIG.6
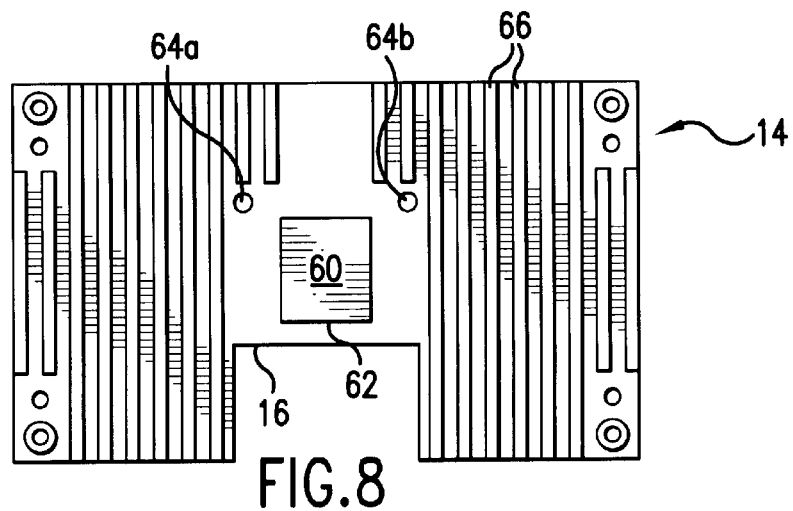
FIG.8

METHOD AND APPARATUS FOR SECURING AN ELECTRONIC COMPONENT

TECHNICAL FIELD

The present invention relates to securing electronic components and more particularly, to a thermoelectric cooling system and an apparatus for securing a thermoelectric cooler.

BACKGROUND INFORMATION

Properly securing electronic components within electronic equipment is often a concern. Many electronic components are easily damaged if not properly aligned and secured. A thermoelectric cooler, for example, can be damaged or destroyed if exposed to excessive shear forces. These shear forces can be introduced to the thermoelectric cooler through handling and testing. In one example, a thermoelectric cooler is used to cool a laser in optoelectronic equipment. The thermoelectric cooler is positioned between the laser and a heat sink such that the cold end of the thermoelectric cooler cools the laser and the hot end transfers heat to the heat sink.

The thermoelectric cooler should be aligned and secured between the laser and heat sink without damaging the cooler. According to one technique, the thermoelectric cooler is manually aligned between top and bottom plates. Solder is then used to secure the thermoelectric cooler while providing thermal isolation between the top and bottom plates secured to the cooler. Although the existing soldering process secures the thermoelectric cooler in place, the solder does not provide compliance against shear forces. If shear forces are applied to the thermoelectric cooler secured using solder, the forces exerted will likely damage or destroy the cooler. The use of solder also involves expensive exotic materials, such as beryllium copper, and the required plating of the ceramics. Furthermore, the assembly process when using solder is difficult and expensive. Moreover, the existing method of soldering can potentially cause thermal contamination due to irregular soldering.

Attempts have also been made to use other forms of mechanical securing devices to secure electronic components. For example, an attempt was made to use pins located and secured to control motion of the thermoelectric cooler along three axes. These pins, however, only control the motion of the thermoelectric cooler and do not supply pressure in compression needed to secure the cooler. Also, when using other forms of mechanical securing devices, forces are not applied evenly and at the correct location, resulting in uneven forces that may damage or destroy the electronic component.

Accordingly, there is a need for an apparatus for securing an electronic component, such as a thermoelectric cooler, in a manner that provides compliance against shear forces. There is also a need for a securing apparatus that provides self-alignment and thermal isolation while minimizing the complexity and cost of the assembly.

SUMMARY

In accordance with one aspect of the present invention, a thermoelectric cooling system is provided. The thermoelectric cooling system comprises a heat sink having a first clamping surface and a mounting plate having a second clamping surface, for mounting an electronic device that generates heat. First and second thermal pads are located on the respective first and second mounting surfaces of the heat sink and the mounting plate. A thermoelectric cooler is positioned between the first and second thermal pads. A clamping mechanism is coupled to the heat sink and the mounting plate such that the thermoelectric cooler is clamped between the heat sink and the mounting plate.

According to another aspect of the present invention, an apparatus is provided for securing a thermoelectric cooler. The securing apparatus comprises a heat sink, a mounting plate, and a clamping mechanism mounted to the heat sink and substantially thermally isolated from the heat sink. The clamping mechanism includes at least one clamping member engaging the mounting plate, whereby the thermoelectric cooler is clamped between the heat sink and the mounting plate.

According to a further aspect of the present invention, an assembly is provided for securing an electronic component. The securing assembly comprises a first plate including a first clamping surface and a second plate including a second clamping surface on one side and a groove on an opposite side. The securing assembly also comprises a clamping mechanism including torsion springs, arms extending from the torsion springs, and a clamping member extending between the torsion springs. The arms are adapted to mount to the first plate and the clamping member is adapted to fit into the groove on the second plate.

The securing assembly preferably comprises first and second thermally insulated mounting structures, such as pins or blocks, for mounting the arms of the clamping mechanism to the first plate and providing thermal isolation. The first and second clamping surfaces are preferably recessed on the respective first and second plates to facilitate alignment of the electronic component.

According to yet another aspect of the present invention, a method is provided for securing a thermoelectric cooler. The method comprises positioning the thermoelectric cooler on a clamping surface of a heat sink and positioning a mounting plate on the thermoelectric cooler. The thermoelectric cooler is clamped between the heat sink and the mounting plate for mounting the thermoelectric cooler using compression forces.

BRIEF DESCRIPTION OF THE DRAWINGS

These and other features and advantages of the present invention will be better understood by reading the following detailed description, taken together with the drawings wherein:

FIG. 3 is a cross-sectional view of the thermoelectric cooling system taken along line 3—3 in FIG. 2;

FIG. 4 is a perspective view of a clamping mechanism in a clamped position, according to one embodiment of the present invention;

FIG. 5 is a cross-sectional view of the clamping mechanism taken along line 5—5 in FIG. 4;

FIG. 6 is a side view of the clamping mechanism at rest;

FIG. 7 is a perspective view of a thermally isolated pin used in the thermoelectric cooling system, according to one embodiment of the present invention;

FIG. 8 is a top plan view of a heat sink used in the thermoelectric cooling system, according to one embodiment of the present invention;

DETAILED DESCRIPTION OF THE PREFERRED EMBODIMENTS

Figure 1:
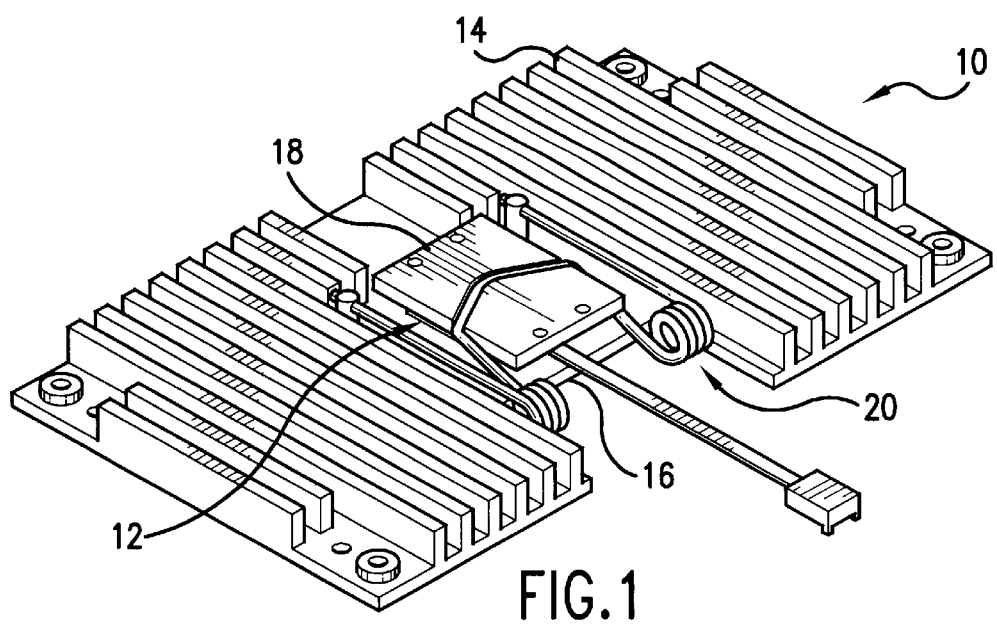
FIG. 1 is a perspective view of a thermoelectric cooling system, according to one embodiment of the present invention.
Figure 2:
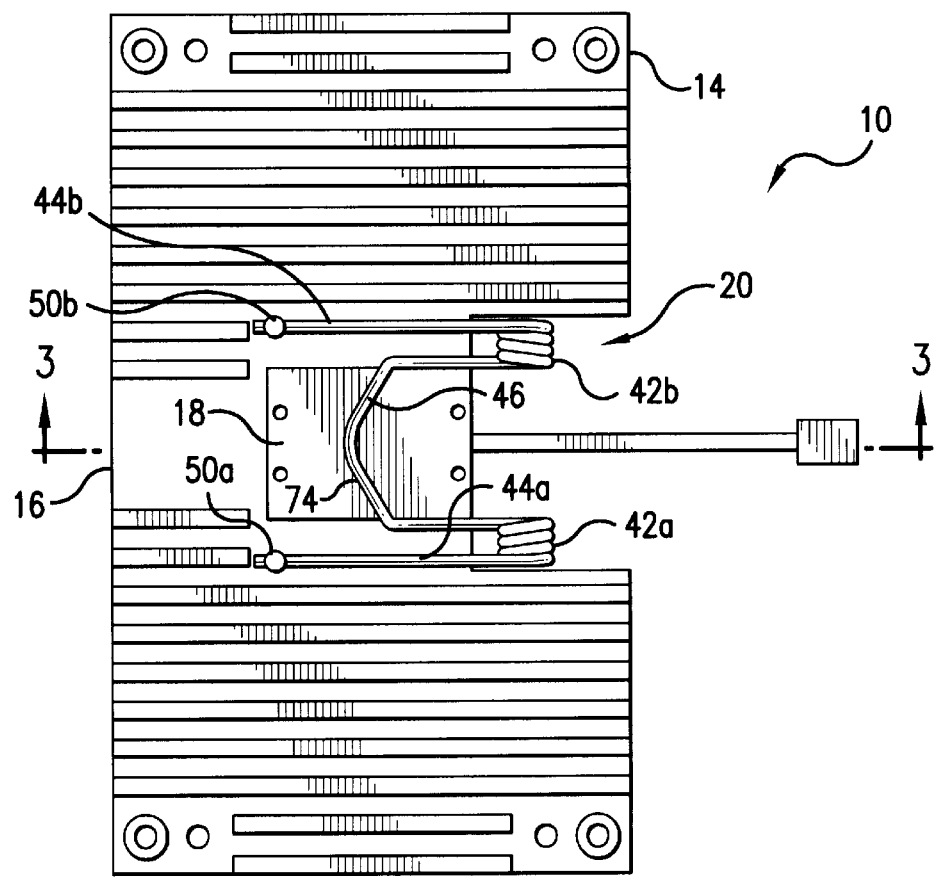
FIG. 2 is a top plan view of the thermoelectric cooling system shown in FIG. 1.

Referring to FIGS. 1–3, an apparatus for securing an electronic component is used in a thermoelectric cooling system 10. The exemplary thermoelectric cooling system 10 includes a thermoelectric cooler 12 secured between a plate 16 of a heat sink 14 and a mounting plate 18. The thermoelectric cooler 12 is preferably secured without generating shear forces capable of damaging the thermoelectric cooler 12. In the exemplary embodiment, the mounting plate 18 is used to mount a heat generating component (not shown), such as a laser. The thermoelectric cooler 12 cools the heat generating component and transfers heat to the heat sink 14. Although the exemplary embodiment shows a thermoelectric cooler, the securing apparatus and method can be used to secure other types of electronic components.

A clamping mechanism 20 aligns and clamps the thermoelectric cooler 12 between the mounting plate 18 and the heat sink plate 16. The clamping mechanism 20 provides compression forces to secure the thermoelectric cooler 12 but generates minimal or no shear forces. In the exemplary embodiment, first and second thermal pads 30, 32 are positioned between the thermoelectric cooler 12 and the respective heat sink plate 16 and mounting plate 18. The thermal pads 30, 32 provide thermal conductivity, shock absorption, and compliance in shear under heavy loading. The thermal pads 30, 32 are preferably graphite pads, such as the type available under the name Chrometrics having a thickness of about 0.001 in. Alternatively, thermal grease or other thermally conductive material can be used between the thermoelectric cooler 12 and the respective plates 16, 18.

One embodiment of the clamping mechanism 20 is shown in greater detail in FIGS. 4 and 5. The exemplary clamping mechanism 20 includes a frame 40 and torsion springs 42a, 42b formed of wire. One example of the wire is made of stainless steel and has a diameter of about 0.062 in. The wire frame 40 includes arms 44a, 44b extending from the respective torsion springs 42a, 42b and a clamping member 46 extending between the torsion springs 42a, 42b. The arms 44a, 44b of the wire frame 40 are secured or mounted to the heat sink 14 and the clamping member 46 engages the mounting plate 18 (See FIGS. 2 and 3). The wire frame 40 thus provides alignment between the heat sink plate 16 and the mounting plate 18 while providing the compression force needed to hold the thermoelectric cooler 12 in place.

As shown in FIG. 6, the arms 44a, 44b form an angle a with respect to the clamping member 42 when the clamping mechanism 20 is at rest. In the exemplary embodiment, the angle α is about 45°. FIGS. 4 and 5 show the clamping mechanism 20 in a clamping position with the clamping member 46 moved toward the arms 44a, 44b, resulting in a compression force being applied by the clamping member 46. The compression force in the exemplary embodiment is preferably about 6 psi, although the force can be varied for different applications. The force is governed by the angle α, the diameter of the wire, the wire material's modulus of elasticity and the diameter of the coils of the torsion springs 42a, 42b. Although the exemplary embodiment of the clamping mechanism provides certain advantages, other types of clamping mechanisms capable of securing an electronic component using compression forces can also be used in the thermoelectric cooling system 10.

The clamping mechanism 20 is preferably thermally isolated from the heat sink 14. In the exemplary embodiment, thermally insulated pins 50a, 50b are used to mount the arms 44a, 44b, respectively, of the wire frame 40 to the heat sink plate 16. As shown in FIG. 7, each of the pins 50 includes an aperture 52 for receiving one of the arms 44a, 44b of the wire frame 40. Each pin 50 is preferably made of a thermally insulated material such as phenolic.

One embodiment of the heat sink 14 is shown in greater detail in FIG. 8. The heat sink plate 16 includes a clamping surface 60, which is preferably recessed to form a pocket 62. The pocket 62 is preferably configured and sized to receive and facilitate alignment of the thermoelectric cooler 12. In one example, the pocket 62 is about 0.080 inches deep. The exemplary embodiment of the heat sink plate 16 also includes holes 64a, 64b for receiving the respective pins 50a, 50b. The heat sink 14 is preferably made of a heat conducting material, such as an aluminum alloy. Although the exemplary heat sink 14 includes fins 66 shown with a particular configuration, the heat sink 14 can have any shape or configuration known in the art.

Figure 9:
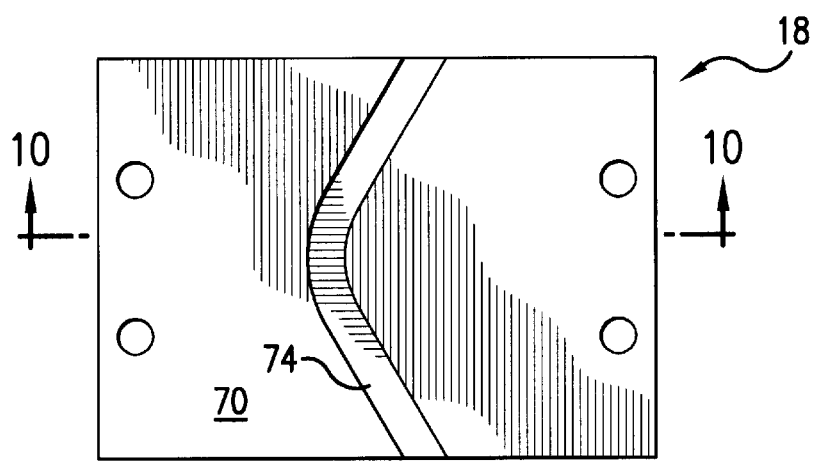
FIG. 9 is a top plan view of a mounting plate, according to one embodiment of the present invention.
Figure 10:
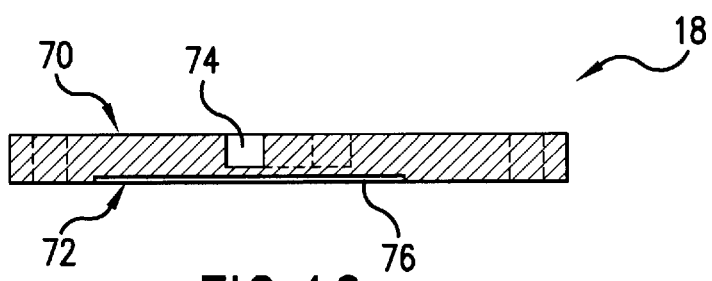
FIG. 10 is a cross-sectional view of the mounting plate taken along line 10—10 in FIG. 9.
Figure 11:
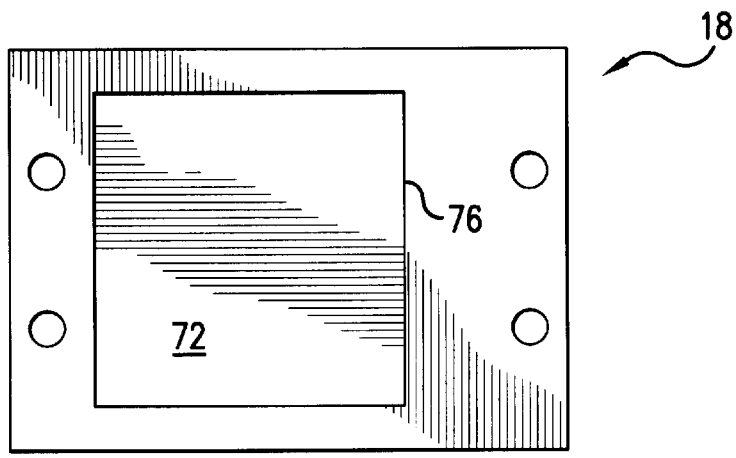
FIG. 11 is a bottom plan view of the mounting plate shown in FIG. 9.
Figure 12:
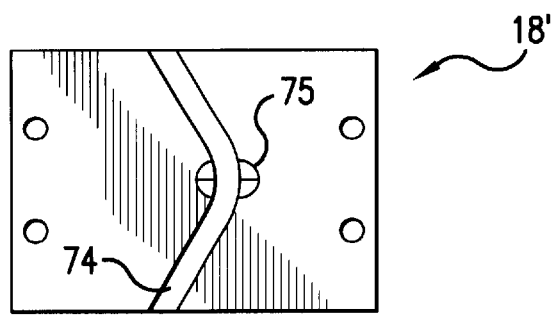
FIG. 12 is a top plan view of the mounting plate, according to another embodiment.

One embodiment of the mounting plate 18 is shown in greater detail in FIGS. 9–11. The mounting plate 18 includes a mounting surface 70 and a clamping surface 72. A groove 74 is preferably formed in the mounting surface 70. The groove 74 receives the clamping member 46 of the clamping mechanism 20. (FIG. 2). The groove 74 and clamping member 46 preferably have a substantially matching shape (e.g., a V-shape) to facilitate alignment of the mounting plate 18 with the clamping mechanism 20. The clamping member 46 preferably does not extend above the mounting surface 70 (see FIG. 3) to avoid interfering with the heat generating component (e.g., the laser) mounted on the mounting surface 70. Another embodiment of the mounting plate 18', shown in FIG. 12, includes a recess 75 adjacent to the groove 74 to allow the clamping member 46 to easily be grasped.

The mounting plate 18 is preferably made of a heat conducting material such as copper. The clamping surface 72 on the mounting plate 18 is preferably recessed to form a pocket 76. The pocket 76 is preferably configured and sized to receive and facilitate alignment of the thermoelectric cooler 12. In one example, the pocket is about 0.010 inches deep. In an alternative embodiment, the pockets 62, 76 on the respective mounting plate 18 and heat sink plate 16 can be eliminated.

Figure 13:
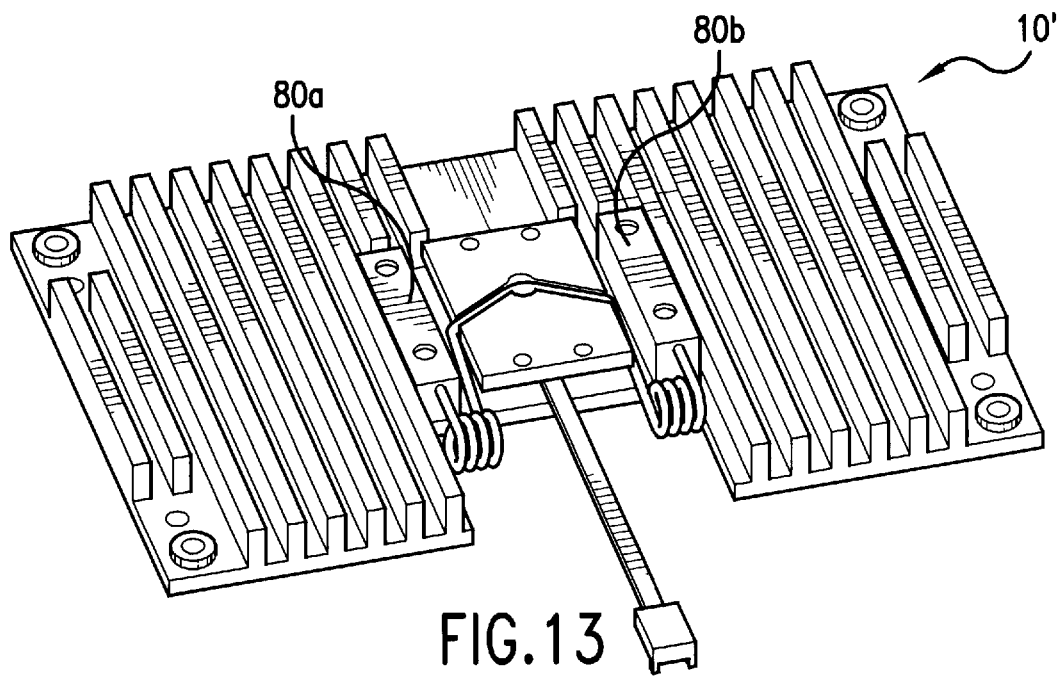
FIG. 13 is perspective view of the thermoelectric cooling system, according to another embodiment.
Figure 14:
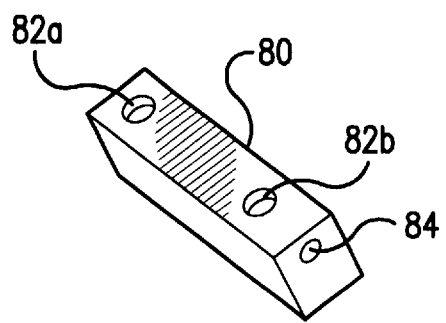
FIG. 14 is a perspective view of a block used in the thermoelectric cooling system shown in FIG. 13.

In an alternative embodiment of the thermoelectric cooling system 10', shown in FIGS. 13 and 14, blocks 80a, 80b are used to mount the arms 44a, 44b of the clamping mechanism 20 to the heat sink plate 16. Each of the blocks 80a, 80b includes one or more holes 82a, 82b for receiving screws to mount the blocks to the heat sink plate 16. Each of the blocks 80a, 80b also include a hole 84 for receiving the respective arms 44a, 44b of the clamping mechanism. Although the disclosed embodiments use pins 50a, 50b or blocks 80a, 80b, other types of mounting structures having various shapes can be used.

One method of assembling the present invention is now described in greater detail. The thermally insulated pins 50a, 50b are pressed into the respective holes 64a, 64b or the blocks 80a, 8b are screwed into in the heat sink plate 16. The thermal pads 30, 32 are placed, substantially equally spaced, on top and bottom surfaces of the thermoelectric cooler 12. The thermal pads 30, 32 are preferably adhered to the thermoelectric cooler 12, for example, with adhesive on the pads 30, 32.

The thermoelectric cooler 12, with the thermal pads 30, 32 attached, is then placed into the pocket 62 on the heat sink plate 16. The arms 44a, 44b of the wire frame 40 are slid into the holes 52 in the respective pins 50a, 50b such that the wire frame 40 is locked into position. The clamping member 46 of the wire frame 40 is lifted and the pocket 76 of the mounting plate 18 is located over the thermal pad 32 on the thermoelectric cooler 12. The clamping member 46 is then located into the groove 74 in the mounting surface 70 of the mounting plate 18 and released.

The thermoelectric cooler 12 is thus self-aligned by fitting into the pockets 62, 76 in the respective plates 16, 18. The wire frame 40 of the clamping mechanism 20 is also aligned by the pins 50a, 50b and the groove 74. Further, the clamping mechanism 20 preferably does not extend outside of the footprint of the thermoelectric cooling system 10. The mounting plate 18 is thermally isolated from the heat sink plate 16 to substantially prevent thermal transfer from the heat sink plate 16 to the mounting plate 18.

Accordingly, the securing apparatus of the present invention allows an electronic component to be self-aligned and secured without being susceptible to damaging shear forces and without using a complex and expensive soldering/plating process with exotic materials.

Modifications and substitutions by one of ordinary skill in the art are considered to be within the scope of the present invention, which is not to be limited except by the following claims.

The invention claimed is:

1. A thermoelectric cooling system comprising:
   a heat sink having a first clamping surface;
   a mounting plate for mounting an electronic device that generates heat, said mounting plate having a second clamping surface;
   first and second thermal pads located on respective said first and second mounting surfaces of said heat sink and said mounting plate;
   a thermoelectric cooler positioned between said first and second thermal pads; and
   a clamping mechanism coupled to said heat sink and said mounting plate such that said thermoelectric cooler is clamped between said heat sink and said mounting plate.

2. The thermoelectric cooling system of claim 1 wherein said first clamping surface is recessed on said heat sink.

3. The thermoelectric cooling system of claim 1 wherein said second clamping surface is recessed on said mounting plate.

4. The thermoelectric cooling system of claim 1 wherein said first and second thermal pads are adhered to opposite sides of said thermoelectric cooler.

5. The thermoelectric cooling system of claim 1 wherein said mounting plate includes a groove on a side opposite said clamping surface, and wherein said clamping mechanism includes a clamping member engaged within said groove.

6. The thermoelectric cooling system of claim 1 wherein said clamping mechanism includes a wire frame and torsion springs.

7. The thermoelectric cooling system of claim 5 wherein said wire frame includes first and second arms for mounting to said heat sink.

8. The thermoelectric cooling system of claim 6 wherein said wire frame includes a clamping member for engaging said mounting plate.

9. The thermoelectric cooling system of claim 6 further comprising thermally insulated mounting structures mounting said first and second arms of said wire frame to said heat sink.

10. The thermoelectric cooling system of claim 6 further comprising at least first and second pins extending from said heat sink, wherein said first and second arms of said wire frame are mounted to said pins.

11. The thermoelectric cooling system of claim 9 wherein said pins are thermally insulated, and wherein said first and second arms of said wire frame are mounted such that said wire frame and said mounting plate are substantially thermally isolated from said heat sink.

12. The thermoelectric cooling system of claim 1 wherein said mounting plate is thermally isolated from said heat sink.

13. An apparatus for securing a thermoelectric cooler, said apparatus comprising:
   a heat sink;
   a mounting plate; and
   a clamping mechanism mounted to said heat sink such that said clamping mechanism is substantially thermally isolated from said heat sink, said clamping mechanism including at least one clamping member engaging said mounting plate, whereby said thermoelectric cooler is clamped between said heat sink and said mounting plate.

14. The apparatus of claim 12 wherein said mounting plate includes a groove, and wherein said clamping member sits in said groove.

15. The apparatus of claim 12 further including thermally insulated pins extending from said heat sink, wherein said clamping mechanism is engaged with said thermally insulated pins.

16. The apparatus of claim 12 wherein said clamping mechanism includes a wire frame and torsion springs.

17. An assembly for securing an electronic component, said securing assembly comprising:
   a first plate including a first clamping surface;
   a second plate including a second clamping surface on one side and a groove on an opposite side; and
   a clamping mechanism including torsion springs, arms extending from said torsion springs, and a clamping member extending between said torsion springs, wherein said arms are adapted to mount to said first plate and said clamping member is adapted to fit into said groove on said second plate.

18. The assembly of claim 16 wherein said groove has a generally V shape, and wherein said wire frame engaging said groove has a matching generally V shape.

19. The assembly of claim 16 further comprising thermally insulated mounting structures for mounting said arms of said clamping mechanism to said first plate.

20. The assembly of claim 16 further comprising thermal pads for positioning on opposite sides of said electronic component.

21. The assembly of claim 16 wherein said first clamping surface is recessed in a pocket on said first plate, and wherein said second clamping surface is recessed in a pocket on said second plate.

22. A method of securing a thermoelectric cooler, said method comprising:

positioning said thermoelectric cooler on a clamping surface of a heat sink;

positioning a mounting plate on said thermoelectric cooler; and clamping said thermoelectric cooler between said heat sink and said mounting plate for mounting said thermoelectric cooler using compression forces.

23. The method of claim 21 further comprising positioning thermal pads on opposite sides of said thermoelectric cooler such that said thermal pads are positioned between said thermoelectric cooler and respectively said heat sink and said mounting plate.

24. The method of claim 21 wherein clamping said thermoelectric cooler includes mounting a clamping mechanism to said heat sink such that said clamping mechanism is substantially thermally isolated from said heat sink.

* * * * *